United States Patent [19]

Fuller et al.

[11] Patent Number: 5,813,345
[45] Date of Patent: Sep. 29, 1998

[54] LITHOGRAPHIC IMAGING SYSTEM FOR INTERCHANGEABLE PLATE CYLINDERS

[75] Inventors: Douglas D. Fuller, Contoocook; Frank G. Pensavecchia, Hudson, both of N.H.; Lawrence J. Carme, Winchester, Mass.

[73] Assignee: Presstek, Inc., Hudson, N.H.

[21] Appl. No.: 709,291

[22] Filed: Sep. 9, 1996

[51] Int. Cl.⁶ .................................................. B41C 1/05
[52] U.S. Cl. .................... 101/463.1; 101/467; 101/479; 101/480; 101/485; 101/401.1; 347/257; 400/59
[58] Field of Search ..................... 101/141, 142, 101/128.4, 170, 401.1, 463.1, 467, 479, 480, 485, 486; 400/55–59; 347/242, 257

[56] References Cited

U.S. PATENT DOCUMENTS

| | | | |
|---|---|---|---|
| 1,635,299 | 7/1927 | Wohlrabe | 101/137 |
| 2,905,768 | 9/1959 | Cronquist | 360/103 |
| 3,041,612 | 6/1962 | Woodcock | 360/109 |
| 3,545,256 | 12/1970 | Beeken | 73/37.5 |
| 3,678,852 | 7/1972 | Feinleib et al. | 101/465 |
| 4,088,215 | 5/1978 | Bader | 400/56 |
| 4,124,854 | 11/1978 | Kirtikar | 347/126 |
| 4,438,444 | 3/1984 | Komada et al. | 347/147 |
| 4,448,867 | 5/1984 | Ohkubo et al. | 430/31 |
| 4,676,675 | 6/1987 | Suzuki et al. | 400/56 |
| 4,718,340 | 1/1988 | Love, III | 101/116 |
| 4,729,310 | 3/1988 | Love, III | 101/157 |
| 4,731,622 | 3/1988 | Hicks et al. | 347/116 |
| 4,751,659 | 6/1988 | Hecht | 364/518 |
| 4,775,869 | 10/1988 | Minowa | 347/197 |
| 4,829,326 | 5/1989 | Emmett et qal. | 347/116 |
| 4,878,127 | 10/1989 | Zollman et al. | 101/128.4 |
| 4,911,075 | 3/1990 | Lewis et al. | 101/453 |
| 5,121,688 | 6/1992 | Williams et al. | 101/142 |
| 5,174,205 | 12/1992 | Kline et al. | 101/467 |
| 5,214,441 | 5/1993 | Blanding et al. | 347/257 |
| 5,293,820 | 3/1994 | Maejima et al. | 101/477 |
| 5,294,943 | 3/1994 | Blanding et al. | 347/257 |

FOREIGN PATENT DOCUMENTS

| | | |
|---|---|---|
| 671744 | 10/1963 | Canada . |
| 130 028 A | 1/1985 | European Pat. Off. . |
| 188477 | 10/1984 | Japan ........................... 400/59 |
| 116581 | 5/1990 | Japan ........................... 400/56 |

OTHER PUBLICATIONS

Holecek et al., *IBM Technical Disclosure Bulletin*, 16:2337 (1973).

*Primary Examiner*—Stephen R. Funk
*Attorney, Agent, or Firm*—Cesari and McKenna, LLP

[57] ABSTRACT

A plate-imaging system and a plate-cylinder support structure are coupled in a manner that achieves precise spacing between a writing head and the surface of a lithographic plate. The imaging unit is designed to permit the writing head undergo controlled advancement toward the plate cylinder, and includes a pair of rollers fixed with respect to the writing head and a spaced so as to facilitate rolling contact with peripheral segments of the cylinder. When the imaging unit is brought into contact with the structure containing the plate cylinder, the writing head is advanced toward the cylinder until the rollers make contact with the peripheral segments. The alignment between the rollers and the writing head is fixed such that rolling contact between the rollers and the peripheral cylinder segments ensures proper spacing between the writing head and a plate mounted to the plate cylinder. To ensure a constant tangential (linear) rotation velocity of the plate cylinder regardless of its diameter, the plate cylinder is driven with a fixed-diameter drive gear. In this way, the tangential velocity of the plate cylinder is constant and determined by the the pitch diameter of the drive gear.

21 Claims, 7 Drawing Sheets

LITHOGRAPHIC IMAGING SYSTEM FOR INTERCHANGEABLE PLATE CYLINDERS

BACKGROUND OF THE INVENTION

1. Field of the Invention

The present invention relates to digital printing apparatus and methods, and more particularly to apparatus for facilitating off-press imaging of printing plates associated with plate cylinders that may be interchangeably introduced into the body of a printing press.

2. Description of the Related Art

In offset lithography, an image to be transferred to a recording medium is present on a printing member as a pattern of ink-accepting (oleophilic) and ink-repellent (oleophobic) surface areas. The printing member is typically a plate, which is loaded onto a plate cylinder of a printing press. In a dry printing system, the plate is simply inked and the image transferred onto a recording medium; the plate first makes contact with a compliant intermediate surface called a blanket cylinder which, in turn, applies the image to the paper or other copying medium. In typical press systems, the blanket cylinder is in rolling contact with an impression cylinder, which forces the recording medium against the blanket cylinder.

In a wet lithographic system, the non-image areas are hydrophilic, and the necessary ink-repellency is provided by an initial application of a dampening (or "fountain") solution to the plate prior to inking. The fountain solution prevents ink from adhering to the non-image areas, but does not affect the oleophilic character of the image areas.

In either case, the recording medium may take a variety of forms ranging from cut paper sheets to continuous "webs" of material such as paper, affixable label stock (which may be die cut after ink application), polymeric packaging or poster material, etc. Thus, variations from job to job can involve not only the image on the plates, but the type and size of the plates and the nature of the recording medium as well. In order to accommodate the diversity of printing requirements likely to be encountered, some printing presses are designed to permit rapid interchange of plate cylinders. In this way, while the press is occupied with one job, the plates for a subsequent job (which may be larger or smaller than those used for the first job, and therefore require a differently sized plate cylinder) can be imaged. These presses typically utilize interchangeable assemblies that include a plate cylinder of a given size, a matching blanket cylinder, and various support structures and hardware.

For example, the Nilpeter M-3300, produced by Nilpeter AS, Slageise, Denmark accepts "cassettes" having matched plate and blanket cylinders journaled into the sides of a support frame, drive gears associated with the cylinders, and support hardware that facilitates operation and mating to complementary components of the printing press. When the cassette is introduced into the press, a train of inking rollers conforms to the plate cylinder and an impression cylinder is brought into contact with the cassette-borne blanket cylinder. Following various connections and couplings, the press is ready to print using the cylinders in the cassette.

Such "modular" presses benefit substantially from digital production of printing plates, since a plate can be mounted onto a freestanding cassette and electronically imaged while another cassette is used in the press. Furthermore, because the plate blank is mounted on the plate cylinder before it is imaged, registration errors that would otherwise arise from mounting inaccuracies are avoided. Suitable electronic imaging apparatus store an imagewise pattern in digital form and impress the pattern directly onto the plate. Plate-imaging devices amenable to computer control include various forms of lasers. For example, U.S. Pat. Nos. 5,351,617, 5,385,092 and 5,339,737, the entire disclosures of which are hereby incorporated by reference, describe ablative recording systems that use low-power laser discharges to remove, in an imagewise pattern, one or more layers of a lithographic printing blank, thereby creating a ready-to-ink printing member without the need for photographic development. In accordance with those systems, laser output is guided from the diode to the printing surface and focused onto that surface (or, desirably, onto the layer most susceptible to laser ablation, which will generally lie beneath the surface layer).

Adapting such digital systems to operate with cassette or other systems involving plate cylinders of arbitrary diameter, however, can pose difficulties. The writing head typically must scan the plate at a precisely defined (and typically very close) distance from its surface. Even if the plate-cylinder diameter and plate thicknesses are known, the fact that the imaging system and plate-cylinder support structure must be mechanically coupled would inevitably result in unacceptably large distance variations, making it impossible to ensure the necessary spacing without cumbersome manual measurements and adjustments. The plate cylinder must also be driven at a consistent imaging speed regardless of the diameter of the plate cylinder. Again, the need to manually determine the cylinder diameter and adjust rotation drive speed increases the inconvenience and time associated with the use of the digital imaging process.

DESCRIPTION OF THE INVENTION

Brief Summary of the Invention

The present invention facilitates coupling of a plate-imaging system and a plate-cylinder support structure in a is manner that achieves precise spacing between the writing head and the surface of a lithographic plate—regardless of whether the diameter of the plate cylinder is known in advance. The invention exploits the existence of peripheral cylinder contact area beyond the edges of a printing plate mounted thereto. The imaging unit is designed to permit the writing head undergo controlled advancement toward the plate cylinder, and includes a pair of rollers fixed with respect to the writing head, and spaced so as to facilitate rolling contact with the peripheral segments of the cylinder. When the imaging unit is brought into contact with the structure containing the plate cylinder, the writing head is advanced toward the cylinder until the rollers make contact with the peripheral segments. The alignment between the rollers and the writing head is fixed such that rolling contact between the rollers and the peripheral cylinder segments ensures proper spacing between the writing head and a plate mounted to the plate cylinder.

The peripheral segments may be cylinder bearers associated with the cylinder support structure. These bearers make contact with complementary bearers associated with the blanket cylinder to facilitate mutual rolling contact, and therefore have precision-ground surfaces adapted for such contact. Other surfaces can also be used. For example, if the axial extent of the cylinder is greater than the width of the widest printing plate mounted thereto and the cylinder body is continuous (i.e., lacks a plate-mounting void) at the axial ends, the continuous segments at the axial cylinder ends can be utilized as contact surfaces. The rollers may be, for example, spring-loaded cam followers. The writing head may be controllably advanced toward the plate cylinder by, for example, a pneumatic piston.

To ensure a constant tangential (linear) rotation velocity of the plate cylinder regardless of its diameter, the plate cylinder is driven with a fixed-diameter drive gear. In this way, the tangential velocity of the plate cylinder is constant and determined by the the pitch diameter of the drive gear.

BRIEF DESCRIPTION OF THE DRAWINGS

The foregoing discussion will be understood more readily from the following detailed description of the invention, when taken in conjunction with the accompanying drawings, in which.

DETAILED DESCRIPTION OF THE PREFERRED EMBODIMENTS

Figure 1:
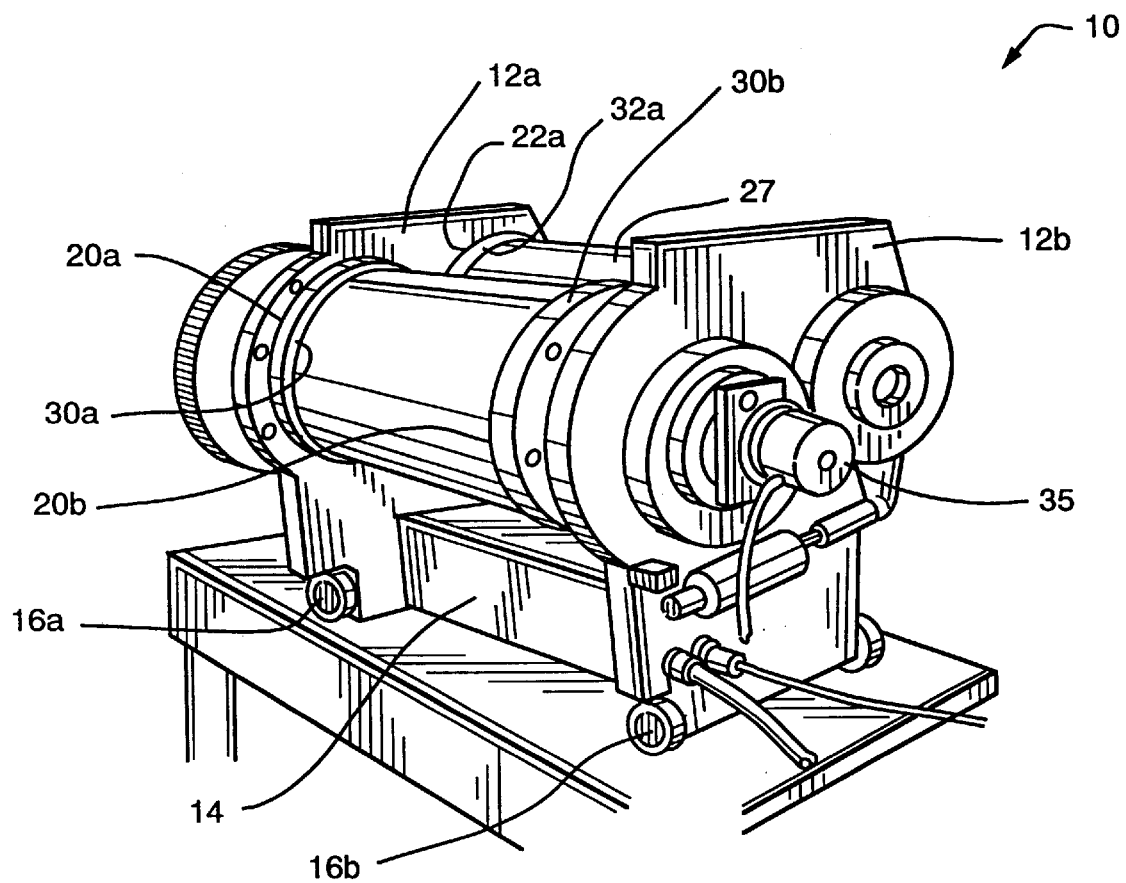
FIG. 1 is an isometric view of a cassette-type structure containing plate and blanket cylinders, and which may be used with the present invention.

Refer first to FIG. 1, which illustrates a plate-cylinder support structure or cassette assembly 10 with which the present invention may be employed. The cassette 10 includes a pair of side walls 12a, 12b joined by a beam 14. The side walls each include a pair of wheels (two of which are shown at 16a, 16b) that permit the assembly 10 to be rolled from a printing press to a table as shown, and vice versa. Journaled into side walls 12a, 12b are two pairs of cylinder bearers (three of which are shown at 20a, 20b and 22a). Bearers 20a, 20b support a plate cylinder 25; bearer 22a and its complement support a blanket cylinder 27. Each bearer has a circumferential rolling surface (three of which are shown at 30a, 30b and 32a) adapted for rolling contact with the complementary bearer of the other cylinder when the assembly 10 is operative within a printing press; for example, bearer surface 30a contacts bearer surface 32a. The angular position of plate cylinder 25 is monitored by conventional means such as a shaft encoder 35 and a detector. Cassette assembly 10 also includes suitable unions and couplings for operative engagement to a printing press, as set forth below.

Figure 2:
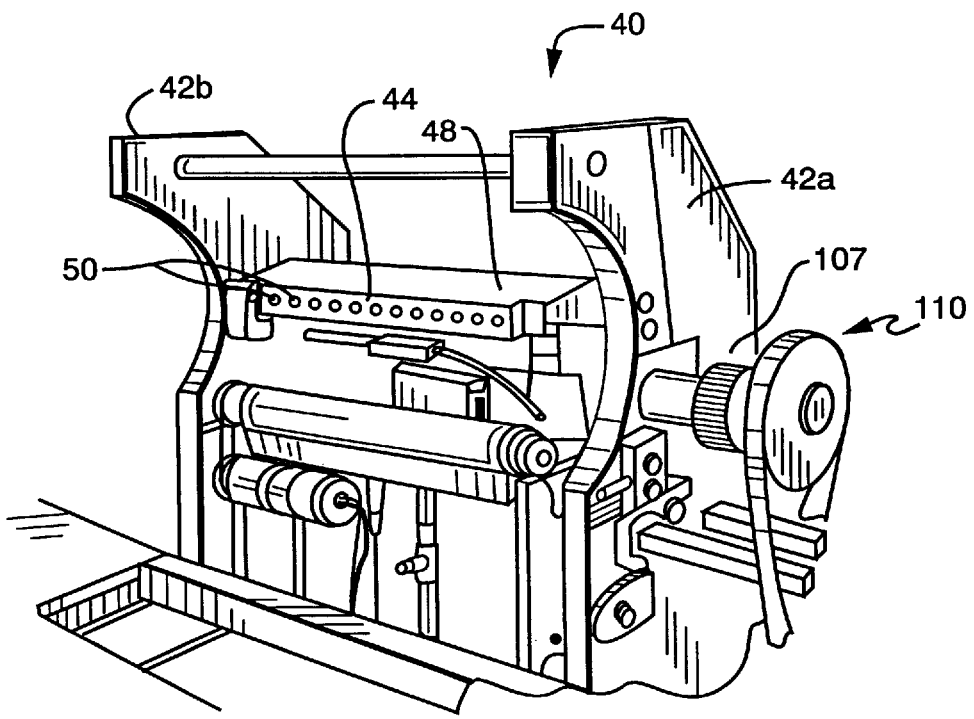
FIG. 2 is an isometric view of an imaging unit in accordance with the present invention.
Figure 3:
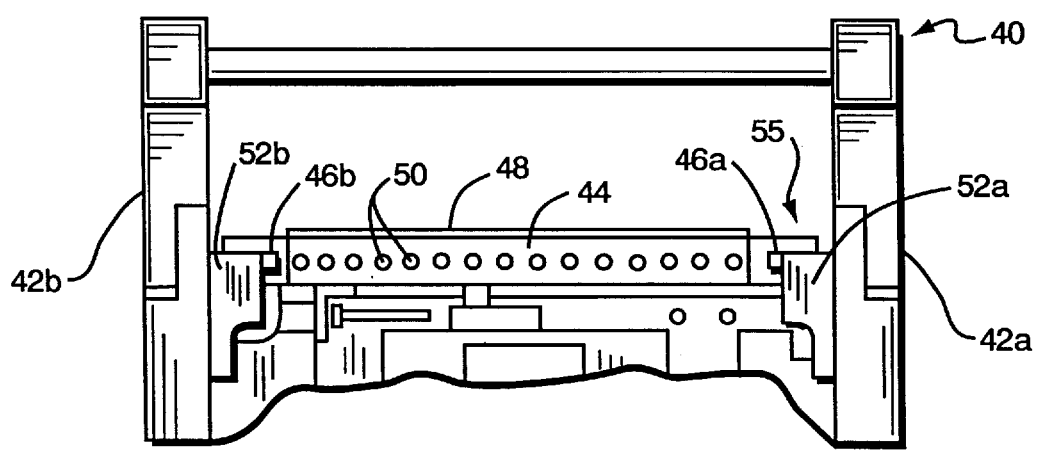
FIG. 3 is a partial front elevation of the imaging unit shown in FIG. 2.

FIGS. 2 and 3 show the basic elements of an imaging unit 40 in accordance with the invention. Unit 40 includes a pair of side walls 42a, 42b spaced apart a distance equal to that separating cassette side walls 12a, 12b, and shaped to complement the profile of the cassette side walls. Located between side walls 42a, 42b are a writing head 44, which applies an image to a plate wrapped around cylinder 25, and a pair of spring-loaded cam followers 46a, 46b (see FIGS. 3 and 5) that make rolling contact with bearer surfaces 30a, 30b, respectively, during operation. Writing head 44 resides within a housing 48 (see FIG. 2) and includes a linear array of imaging devices 50. Preferably, these comprise lens assemblies each of which focuses the output of an associated laser onto the surface of the plate, as described in the '617, '092 and '737patents mentioned above. The system comprises means for scanning laser output over the plate, said means including a controller (discussed below) that actuates the various lasers when they reach appropriate points opposite the plate, and a stepper motor (not shown), also operated by the controller, that draws writing head 44 axially along cylinder 25. The controller receives data from two sources: shaft encoder 35, which provides the angular position of cylinder 25 with respect to writing array 44; and an image data source (e.g., a computer). The image data define points on plate 25 where image spots are to be written. The controller, therefore, correlates the instantaneous relative positions of writing array 44 and plate 25 (as reported by detector 35) with the image data to actuate the appropriate laser drivers at the appropriate times during scan of plate 25. The control circuitry required to implement this scheme is well-known, and exemplary implementations are described in the '617, '092 and '737 patents.

Figure 5:
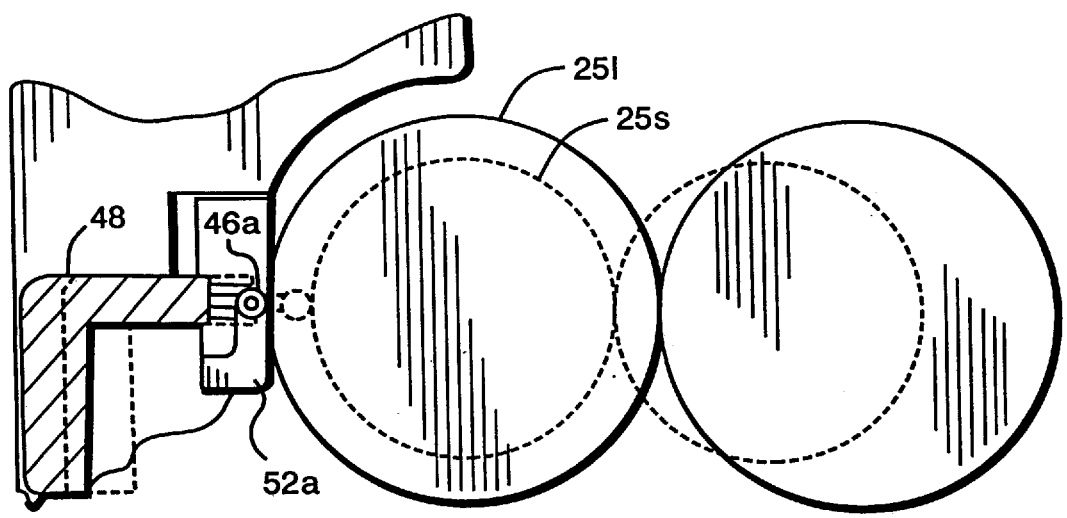
FIG. 5 schematically depicts accommodation of differently sized plate cylinders.

Cam followers 46a, 46b are each mounted on a fixture 52a, 52b. These fixtures, the housing 48 and writing head 44 define a subassembly 55 capable of shifting toward or away from cylinder 25. As best seen in FIG. 5, this movement of subassembly 55 draws writing head 44 toward or away from the surface of cylinder 25 when the unit 40 is in contact with cassette assembly 10. Because the thickness of the plates to be borne on cylinder 25 is generally known, the spacing between writing head 44 and cam followers 46a, 46k can be arranged such that contact between the cam followers and surfaces 30a, 30b ensures proper spacing between imaging devices 50 and the anticipated location of the plate surface.

Figure 4A:
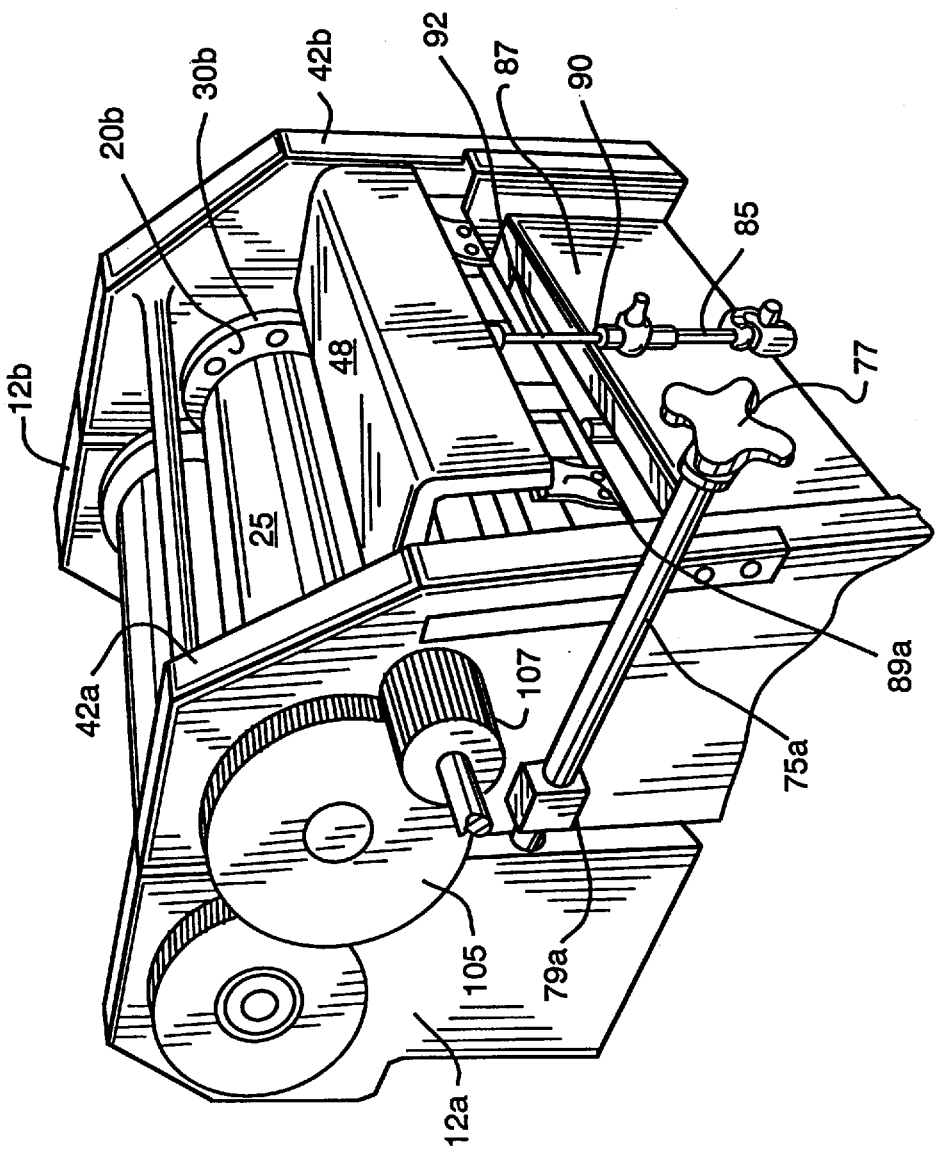
FIG. 4A is an isometric view showing the imaging unit coupled to the cassette assembly, with the writing head retracted.
Figure 4B:
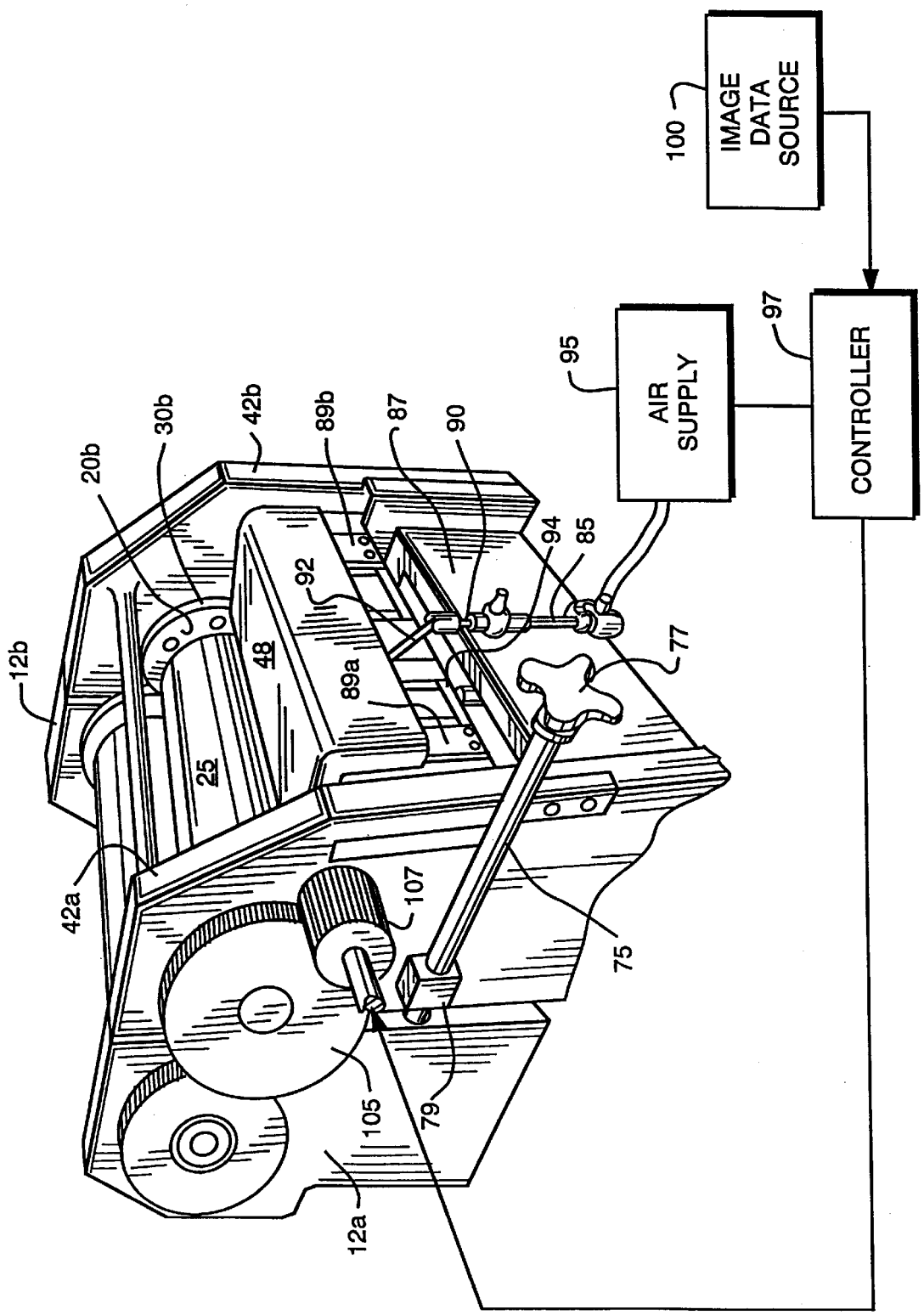
FIG. 4B is an isometric view (with schematic elements) showing the imaging unit coupled to the cassette assembly, with the writing head extended.

Marriage of unit 40 and cassette assembly 10, and the manner in which subassembly 55 shifts to place cam followers 46a, 46b into contact with bearer surfaces 30a, 30b are shown in FIGS. 4A, 4B and 5. Opposed edge faces of walls 42a, 12a and 42b, 12b are brought into alignment and secured against one another by a pair of locking rods, one of which is shown at 75A. These are shafts that terminate at one end in a grip handle, as indicated at 77, and at the other in a threaded portion. Rods 75 each pass through a retention fixture (one of which is shown at 79a) mounted to walls 42a, 42k, respectively, their threaded ends engaging complementary threaded bores through walls 12a, 12b. Turning the rods 75 eventually clamps together the abutting faces of the walls 42a, 12a and 42k, 12k.

Movement of subassembly 55 is accomplished by a pneumatic cylinder 85, secured to a stationary beam 87 fixedly joining walls 42a, 42b. The reciprocating piston 90 extending from cylinder 85 is hingedly coupled to a rocker arm 92, which is itself pivotably coupled to subassembly 55. The path along which subassembly 55 shifts is dictated by a series of deformable support members, two of which are shown at 89a, 89k (a total of four being preferred); each of these is secured at one end to subassembly 55 in a manner that permits axial motion of writing head 44 for imaging, and at the other end to a cross-member 94 stationary with respect to walls 42a, 42b. The natural (undeformed) state of the deformable support members would be to urge cam followers 46a, 46b against the bearer surfaces 30a, 30b of a cylinder 25 having the smallest allowed diameter. Retraction of piston rod 90 from the state shown in FIG. 4B deforms support members 89a, 89k, as shown in FIG. 4A, drawing subassembly 55 (including housing 48) away from cylinder 25. Typically, subassembly 55 is maintained in the position shown in FIG. 4A during setup, and advanced (through controlled relaxation of the deformable members via piston 85) toward cylinder 25 in preparation for imaging. With renewed reference to FIG. 5, it can be seen that the ability to controllably advance subassembly 55 toward cylinder 25 until cam followers 46a, 46b meet surfaces 30a, 30b results in accommodation of differently sized cylinders 25l, 25s, since the precisely chosen, fixed alignment between devices 50 and the cam followers ensures a consistent ultimate distance between devices 50 and cylinder 25 regardless of cylinder diameter. (It should be noted that, depending on the design of the cassette, the axis of rotation of differently sized plate cylinders may shift toward or away from subassembly 55; cylinders 25l and 25s are depicted coaxially for simplicity of presentation.)

In operation, pneumatic cylinder 85 is actuated by charging with air from a compressed air supply 95, shown in FIG. 4B. Air supply 95, in turn, is controlled by a main system controller 97, which also orchestrates the operation of imaging devices 50 based on image data received from a source 100 (such as a prepress computer). Controller 97 causes piston rod 90 to extend until cam followers 46a, 46b meet surfaces 30a, 30b, after which the elasticity of the (at least partially) unrelaxed deformable members maintains contact between the cam followers and the respective surfaces. The deformable members are typically elongated sheets of metal, such as steel, whose length and modulus are chosen such that the full excursion of retraction will not cause the members to yield or experience fatigue.

Variations on this design are possible. For example, one could utilize relatively weak deformable support members whose function is primarily to dictate a path of motion rather than to provide the contact force urging cam followers 46a, 46b against surfaces 30a, 30b; instead, that force may be provided by cylinder 85 (along or in conjunction with an additional pneumatic cylinder). An advantage to this approach is greater control over contact force (which can be precisely applied by operation, by controller 97, of the pneumatic cylinder(s)) and less stress on the support members.

Plate cylinder 25 is rotated by a gear 105, the shaft of which extends through side wall 12a. A drive gear 107, journaled into side 42a of imaging unit 40, is connected to a source of rotary power and configured to mesh with gear 105 when imaging unit 40 and cassette assembly 10 are properly aligned. For example, as shown in FIG. 2, gear 107 can be rotated by a belt-and-pulley assembly 110. By rotating gear 107 at a fixed velocity regardless of the diameter of gear 105 or cylinder 25, the surface of cylinder 25 must rotate at a constant tangential velocity regardless of cylinder diameter, the tangential velocity being determined by the pitch diameter of gear 107 and its rotational velocity (governed by controller 100 to ensure suitability for imaging).

Figure 6:
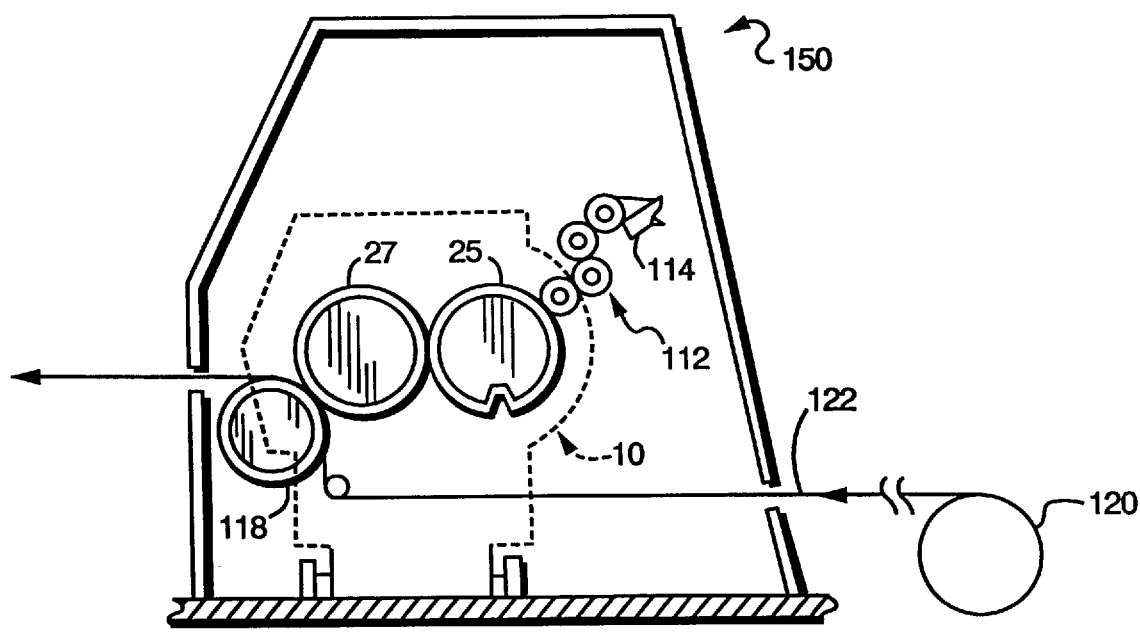
FIG. 6 is a schematic view of a printing press incorporating the cassette.

After the plate surrounding cylinder 25 is fully imaged, cassette assembly 10 is detached from imaging unit 40 and is ready for use in a printing press. Ordinarily, the press will contain multiple printing stations each designed to accept a cassette. One such station is shown in FIG. 6 at 150. The cassette 10 is brought to the press and rolled into station 150. Once cassette 10 is loaded and the various electrical, mechanical and pneumatic couplings made, a series of inking rollers 112 extends from an ink tray 114 in a continuous train to plate cylinder 25. An impression cylinder 118 is brought into contact with blanket cylinder 27, forming a nip that accepts web material from a source 120 along a printing path 122. In operation, ink is continuously transferred, via blanket cylinder 27, to web material in the imagewise pattern inscribed on the plate supported by plate cylinder 25; the web material exits station 150 for collection or entry into another print station.

It will therefore be seen that the goal of convenient and reliable imaging on a cassette-bound plate are efficiently obtained in accordance with the foregoing teaching. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed. For example, as stated earlier, it is not necessary to know in advance the diameter of cylinder 25; it is possible to configure controller 97 to identify this quantity based on the necessary extension of piston 90. Knowledge of cylinder diameter can be used, for example, to modify (e.g., linearly scale) image data for application to plates of varying sizes as indicated by the computed cylinder diameter, as set forth, for example, in U.S. Pat. No. 5,174,295, the entire disclosure of which is hereby incorporated by reference. The design of cassette 10 can also be varied; for example, the cassette need not contain both plate and blanket cylinders.

What is claimed is:

1. Apparatus for imaging a lithographic printing member having a width and a predetermined thickness, the apparatus comprising:
   a. for supporting the printing member, a rotatable plate cylinder having an axial extent greater than the width of the printing member and having a selected diameter within a predetermined range;
   b. peripheral contact surfaces associated with the plate cylinder and separated by a distance greater than the width of the printing member;
   c. an imaging unit for placing a lithographic image onto the printing member;
   d. a pair of rollers in fixed alignment with the imaging unit, the rollers being separated by a distance greater than the width of the printing member; and
   e. means for controllably advancing the imaging unit toward the plate cylinder until the rollers meet the contact surfaces to thereby provide a predetermined spacing between the imaging unit and the printing member regardless of the selected cylinder diameter.

2. The apparatus of claim 1 wherein the contact surfaces are located on bearing members for the cylinder.

3. The apparatus of claim 2 wherein the cylinder is housed within a support structure comprising a pair of side walls and a blanket cylinder having a pair of bearing members associated therewith, the bearing members of the plate cylinder and the blanket cylinder being configured for mutual rolling contact and rotation within the side walls.

4. The apparatus of claim 3 further comprising means for releasably coupling the support structure to the imaging unit.

5. The apparatus of claim 3 wherein the support structure comprises means facilitating entry into a printing press having an impression cylinder, a source of ink and a source of a recording medium, the impression cylinder and the source of ink being configured for contact with the plate cylinder and the blanket cylinder following entry of the support structure, contact between the blanket cylinder and the impression cylinder forming a nip for receiving the recording medium.

6. The apparatus of claim 1 wherein the rollers are spring-loaded cam followers.

7. The apparatus of claim 1 wherein the means for controllably advancing the imaging unit comprises an electronically actuable pneumatic piston.

8. The apparatus of claim 1 further comprising means for identifying a plate-cylinder diameter based on an amount of advancement of the imaging unit toward the plate cylinder until the rollers meet the contact surfaces.

9. The apparatus of claim 1 wherein the imaging unit comprises:
   a. at least one laser source capable of producing an imaging output;
   b. a source of image data;
   c. means for scanning the imaging output over the printing member in accordance with the image data so as to create an image on the printing member corresponding to the image data.

10. The apparatus of claim 9 further comprising:
    a. means for identifying a plate-cylinder diameter based on an amount of advancement of the imaging unit toward the plate cylinder until the rollers meet the contact surfaces; and
    b. means for modifying the image data to accommodate the identified plate-cylinder diameter.

11. Printing apparatus comprising, in combination:
    a. a cassette comprising:
       i. a rotatable plate cylinder for supporting a printing member having a width, the plate cylinder having an axial extent greater than the width of the printing member and a selected diameter within a predetermined range;
       ii. peripheral contact surfaces associated with the plate cylinder and separated by a distance greater than the width of the printing member; and
    b. an imaging unit comprising:
       i. at least one writing head for placing a lithographic image onto the printing member;
       ii. a pair of rollers in fixed alignment with the imaging unit, the rollers being separated by a distance greater than the width of the printing member;
       iii. means for releasably coupling the imaging unit to the cassette; and
       iv. means for controllably advancing the imaging unit toward the plate cylinder of the coupled cassette until the rollers meet the contact surfaces of the plate cylinder to thereby provide a predetermined spacing between the imaging unit and the printing member regardless of the selected cylinder diameter.

12. The apparatus of claim 11 wherein the cassette further comprises a blanket cylinder configured for rolling contact with the plate cylinder.

13. The apparatus of claim 12 further comprising a printing press including:
    a. an impression cylinder;
    b. a source of ink; and
    c. a source of a recording medium, the cassette being disposed within the press such that the the source of ink contacts the plate cylinder and the impression cylinder contacts the blanket cylinder, contact between the blanket cylinder and the impression cylinder forming a nip for receiving the recording medium.

14. The apparatus of claim 11 wherein the contact surfaces are located on bearing members for the cylinder.

15. The apparatus of claim 11 wherein the rollers are spring-loaded cam followers.

16. The apparatus of claim 11 wherein the means for controllably advancing the imaging unit comprises an electronically actuable pneumatic piston.

17. The apparatus of claim 11 wherein the imaging unit comprises:
    a. at least one laser source capable of producing an imaging output;
    b. a source of image data;
    c. means for scanning the imaging output over the printing member in accordance with the image data so as to create an image on the printing member corresponding to the image data.

18. Printing apparatus comprising, in combination:
    a. a rotatable plate cylinder for supporting a printing member; and
    b. an electronic imaging unit comprising at least one writing head for placing a lithographic image onto the printing member; and
    c. means for removably associating the imaging unit with the plate cylinder so as to facilitate placement of the lithographic image on the printing member,
       the plate cylinder comprising means facilitating loading into a printing press and operative coupling there following separation of the plate cylinder from the imaging unit.

19. The apparatus of claim 18 further comprising a cassette within which the plate cylinder is rotatably mounted.

20. The apparatus of claim 19 wherein the cassette further comprises a blanket cylinder in rolling contact with the plate cylinder.

21. The apparatus of claim 20 further comprising a printing press including:
    a. an impression cylinder;
    b. a source of ink; and
    c. a source of a recording medium, the cassette being disposed within the press such that the the source of ink contacts the plate cylinder and the impression cylinder contacts the blanket cylinder, contact between the blanket cylinder and the impression cylinder forming a nip for receiving the recording medium.

* * * * *